United States Patent [19]

Ricard

[11] 4,389,563

[45] Jun. 21, 1983

[54] TAXIMETER SYSTEM FOR AVOIDING OPERATOR FRAUD IN THE COMPUTATION AND DISPLAY OF TRIP FARES

[76] Inventor: Claude F. Ricard, 10 Oliveraie G-Rte. de Nice, Aix-en Provence, France, 13100

[21] Appl. No.: 194,261

[22] Filed: Oct. 6, 1980

[30] Foreign Application Priority Data

Oct. 12, 1979 [FR] France ................ 79 25736

[51] Int. Cl.³ ................ G07B 13/10; G06F 15/20
[52] U.S. Cl. ................ 377/20; 364/467; 235/30 R; 235/45; 377/24; 377/26
[58] Field of Search ............ 364/467; 235/92 DN, 235/92 FP, 92 TC, 92 MT, 92 CP, 92 PE, 92 DM, 144 ET, 30 R, 33, 45, 97, 91 D, 92 P, 92 CA, 927, 92 R

[56] References Cited

U.S. PATENT DOCUMENTS

| | | | |
|---|---|---|---|
| 2,934,159 | 4/1960 | Butler | 235/92 FP |
| 3,522,481 | 8/1970 | Terzic | 317/31 |
| 3,568,175 | 3/1971 | Schwehr et al. | 340/249 |
| 3,809,312 | 5/1974 | Warrick et al. | 235/30 R |
| 3,852,732 | 12/1974 | Yorksie et al. | 340/249 |
| 3,918,043 | 11/1975 | Beck | 340/663 |
| 3,969,635 | 7/1976 | Wilke | 307/350 |
| 4,000,446 | 12/1976 | Vandevier et al. | 361/31 |
| 4,001,777 | 1/1977 | Alexander | 340/68 |
| 4,021,645 | 5/1977 | Saufferer et al. | 235/92 TC |
| 4,217,484 | 8/1980 | Gerst | 235/92 DN |
| 4,245,150 | 1/1981 | Driscoll et al. | 235/92 FP |

FOREIGN PATENT DOCUMENTS 2238195 2/1975 France .
2417143 9/1979 France .

*Primary Examiner*—Raulfe B. Zache
*Assistant Examiner*—Archie E. Williams
*Attorney, Agent, or Firm*—Brumbaugh, Graves, Donohue & Raymond

[57] ABSTRACT

This anti-fraud system includes a process and devices for avoiding fraud on the price indicated by an electronic taximeter. The taximeter apparatus, which includes a luminous display unit and a computing unit, is supplied with d.c. voltage V by the vehicle battery. One particular fraud, made more difficult by this system, involves voluntary cut-off of the voltage supply to the meter. To execute this fraudulent maneuver the cab-driver firstly starts the meter, and records a price on the fare meter, with no passenger in the taxi. Secondly, before a customer is picked up, the operator cuts off the current supply to the meter, which extinguishes the fare display. Thus, as the customer enters the cab, it is not apparent that the meter has already been run-up to a non-zero value. To preclude this maneuver, the anti-fraud system has a first comparator which compares the voltage V with a reference voltage Vr and emits a constant voltage Vc if V<Vr and a zero voltage if V>Vr. Another comparison device compares the duration during which V remains lower than Vr with a reference time period duration. The computing unit and the display unit are returned to zero each time the reference time period duration is exceeded.

4 Claims, 3 Drawing Figures

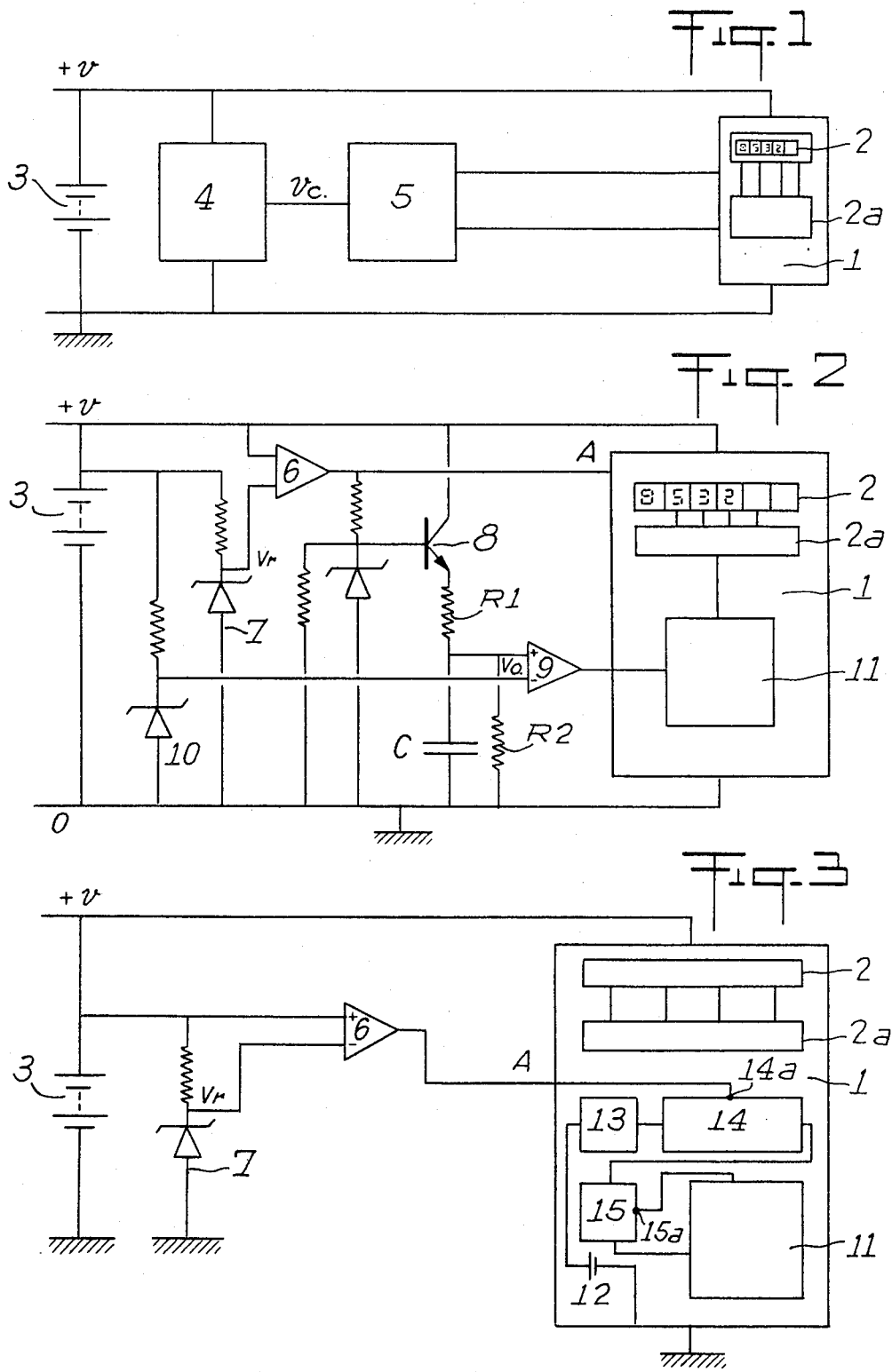

TAXIMETER SYSTEM FOR AVOIDING OPERATOR FRAUD IN THE COMPUTATION AND DISPLAY OF TRIP FARES

BACKGROUND OF THE INVENTION

1. Field of the Invention

The present invention relates to a process, devices and taximeters equipped with these devices for avoiding fraud on the price indicated by the luminous display means of an electronic taximeter.

The technical sector of the invention is that of the construction of electronic taximeters with luminous display means.

2. Description of the Prior Art

Former mechanical taximeters comprising display means composed of rotating rollers are being progressively replaced by electronic meters comprising a luminous device for displaying the price of the fare, for example a liquid crystal or electroluminescent diode device or any other equivalent luminous display device.

An electronic taximeter is a measuring apparatus for determining the price to be paid by a client. An essential quality of such an apparatus is that those persons using it cannot cheat the client by making him/her pay a price higher than the legal price.

It has appeared that the luminous display devices of electronic taximeters could give rise to fraud by voluntary cut-off of the current supplying the taximeter.

The electronic circuits of taximeters are supplied with a d.c. voltage by the battery of the vehicle as long as the voltage delivered by this battery is greater than a threshold voltage below which the electronic circuits can no longer function normally. In order to avoid erroneous indications of price, electronic taximeters generally comprise a safety device which compares the voltage delivered by the battery with a reference voltage which corresponds to the safety threshold below which the electronic circuits would risk defective functioning. This safety device produces a signal as soon as the voltage delivered by the battery falls below the safety threshold and interrupts the functioning of the taximeter. However, accidental voltage drops of short duration may occur during a fare, for example if the battery discharges slightly and if the driver of the taxi actuates the starter to start up the engine again after an accidental or voluntary stoppage thereof. Such accidental voltage drops cause the extinction of the luminous display means and, when voltage returns to normal, these display means must resume metering at the value which had been displayed before extinction.

It will be recalled that the luminous display means are increased step by step by a set quantity or increment which is for example ten or fifty cents. This increment corresponds for example, depending on the tariffs applied, to a distance of 1/10 mile or 100 meters or to a waiting time of 50 seconds.

These particularities of functioning of electronic taximeters equipped with luminous display means have given rise to fraud. One type of fraud consists in switching on the meter before a client has been picked up, for a stationary period which is slightly less than the period which corresponds to an increment of the fare, so that the luminous display means remains at zero. The electrical supply of the taximeter is then cut off, and is re-established at the instant when the client enters the taxi and when the "free-busy" switch is maneuvered. At this moment, the normal picking up price appears on the display means and, only a few seconds later, this price is increased by an increment, so that the taxi driver obtains an extra increment for each fare.

Another fraud consists in recording a price on the taximeter before a client is picked up, then in cutting the electrical supply of the taximeter until a client enters the taxi, so that, at that moment, the luminous display means is extinguished.

The electrical supply of the taximeter is re-established at the same time as or just before the "free-busy" switch is maneuvered, so that at that moment a price appears on the luminous display means which is equal to the sum of the picking up price and the fraudulently recorded price. An inattentive client will not differentiate this price from the picking up price which should normally be displayed.

SUMMARY OF THE INVENTION

It is an object of the present invention to provide electronic taximeters with luminous display equipped with an anti-fraud device which avoids the possibilities of fraud by voluntary cut-off of the current supplying the taximeter.

A simplified anti-fraud device would consist in returning the meter and display means to zero each time the supply voltage of the taximeter becomes zero or less than a safety threshold. Such a device would lead to the price being erased each time a voltage drop occurs accidentally during a paying fare, which would obviously be unacceptable.

It is therefore an object of the present invention to provide means which do not return the meter to zero for voltage drops of short duration occurring accidentally in the course of a paying fare, while still avoiding or limiting the possibilities of fraud caused by a voluntary cut-off of the electrical supply of the taximeter.

These objects are attained by means of a process for avoiding fraud on the price of the fare indicated by the electronic taximeters comprising a computing unit and a luminous display means, said process comprising the following operations:

the supply voltage of the taximeter is compared with a safety voltage threshold;

each time the supply voltage drops below said safety voltage threshold, the actual time during which it remains lower than said threshold is compared with a reference time duration;

and when the supply voltage returns to exceed the safety voltage threshold the fare value in computing unit and the luminous display means are returned to zero if the actual time period is greater than the reference time duration, but returning the computing unit and the luminous display to the fare value existing when the supply voltage dropped below said safety voltage threshold if the actual time period is less than the reference time period.

According to a first embodiment, a device according to the invention for avoiding fraud on the price indicated on the luminous display means of a taximeter supplied with current from the battery of the taxi vehicle, comprises:

a first comparator means which compares the voltage delivered by the battery with a first reference voltage and which delivers a first voltage signal if the supply voltage delivered by the battery is greater than said reference voltage;

means for measuring the actual time period duration that the supply voltage level is below said safety threshold voltage level;

means for comparing the actual time period duration that the supply voltage level was below the safety threshold voltage level with a predetermined time period; and means for resetting the fare value in computing unit and the display means to zero when the supply voltage returns to exceed the safety voltage threshold if the actual time period exceeded the predetermined time period, and for returning the computing unit and the display means to the fare existing at the time the supply voltage dropped below said safety voltage threshold when the supply voltage returns to exceed the safety voltage threshold if the actual time period did not exceed the predetermined time period.

According to a second embodiment, an anti-fraud device according to the invention comprises an auxiliary source of current, of small capacity, which supplies electrical current to the circuits comprising:

an electronic clock a pulse counter, of determined capacity, on the input of which said clock is connected;

a comparator which compares the voltage delivered by the battery of the taxi with a first reference voltage and which delivers, on its output terminal, a first voltage if the supply voltage delivered by the battery is greater than said reference voltage, and a second voltage if it is lower, which output terminal is connected to the terminal for returning said pulse counter to zero and returns the counter to zero on a high level.

a memory which is connected to the output of said pulse counter and which changes state if the number of pulses counted by said counter reaches the maximum capacity thereof;

and logic circuits which are connected to said memory and which return said computing unit and luminous display to zero each time said memory indicates that said pulse counter has reached its maximum capacity and when said supply voltage returns to exceed said reference voltage, which logic circuits are connected to the return to zero of the memory in order to return the output to zero when the memorized information contained in memory has been taken into account.

The invention results in improved electronic taximeters equipped with a device which avoids fraud on the price indicated by the luminous display means of the apparatus.

An essential advantage of the taximeters according to the invention lies in the fact that they reduce the possibilities of fraud on the price to be paid by the client in cases of voluntary cut off of the electrical supply of the taximeter which exceed a certain time period, with metering resuming normally after a voltage drop of short duration.

BRIEF DESCRIPTION OF THE DRAWINGS

The invention will be more readily understood on reading the following description with reference to the accompanying drawings, in which:

FIG. 1 is a block diagram of a taximeter having an anti-fraud device according to the invention.

FIGS. 2 and 3 show circuit diagrams of two embodiments of taximeters equipped with an anti-fraud device according to the invention.

DETAILED DESCRIPTION OF THE PREFERRED EMBODIMENTS

Referring now to the drawings, FIG. 1 is a diagram which enables the steps of the anti-fraud process forming the subject of the invention to be explained.

Reference numeral 1 represents an electronic taximeter, of any known model, comprising a luminous display means 2 on which the price of the fare appears. It will be recalled that this price is calculated by a computing unit 2a, which adds up either the waiting times or the distances covered, choosing at each instant that which is most advantageous for the taxi.

The taximeter 1 is supplied with direct current by the battery 3 of the vehicle, for example a battery which delivers a voltage of 12 volts.

The luminous display means extinguishes in case of cut-off of the electrical supply or in case of drop of the supply voltage. If this cut-off or voltage drop occurs during a paying fare, when the normal supply of the taximeter is re-established, the computing unit and the luminous display means resume their functioning of fare calculation and the like at the point which they had reached when they were cut off in certain cases. As discussed above, this particularity of electronic taximeters equipped with a luminous display means may give rise to fraud on the price displayed by means of voluntary cut-offs of the electrical supply of the taximeter 1.

To remedy these possibilities of fraud, the supply voltage V of the taximeter delivered by the battery 3 is compared by means of a comparator 4 with a reference voltage Vr which is much lower than normal supply voltage. For example, if the battery 3 delivers a supply voltage V of 12 volts, comparison is made with reference voltage Vr of 6 volts. The comparator 4 delivers a first voltage Vc as long as the supply voltage $V>Vr$, and delivers a second voltage when the supply voltage $V<Vr$. These two voltages constitute a binary logic signal. The second voltage is preferably zero.

The output of the comparator 4 is connected to a time comparator circuit 5 which compares the actual time period during which the voltage Vc is zero with a reference time duration which is of the order of about ten seconds, for example, i.e. much greater than the maximum duration of the voltage drops which may occur accidentally during a fare.

When the supply voltage V is re-established to a value above the reference voltage Vr, the time comparator circuit 5 delivers a signal which may take two values. If the actual time duration during which the voltage Vc has remained zero exceeds the reference time duration, the circuit 5 delivers a signal for returning the computing unit and the luminous display means 2 of the taximeter to zero. If, on the contrary, the actual time duration during which the voltage Vc has remained zero is shorter than the reference time duration, the signal delivered by the circuit 5 allows the computing unit and the display means to be switched on again, resuming their operations at the point which they had reached when the supply voltage V was interrupted.

FIG. 2 shows an embodiment of the anti-fraud circuits carrying out the process of the invention.

This Figure shows the taximeter 1 equipped with a luminous display means and a computing unit 2a and the battery 3 of the vehicle, which delivers for example a d.c. voltage V of 12 volts and which supplies the electronic components of the taximeter and the anti-fraud device.

Reference 6 represents an operational amplifier mounted as a comparator which compares the supply voltage V with a reference voltage Vr which is determined by the Zener diode 7. The reference voltage Vr, which is the breakdown voltage of the Zener diode, is equal for example to the safety threshold below which the functioning of the electronic components which compose the taximeter risks being disturbed. Such a device generally exists on known taximeters. When the supply voltage V drops to below the threshold Vr, the comparator 6 sends onto the input terminal A of the taximeter a zero voltage which interrupts the functioning of the taximeter and which causes the information contained at that moment in the computing unit to be stored. When the supply voltage V returns and becomes greater than the safety threshold Vr again, the comparator 6 delivers a constant voltage, which constitutes the high level of a binary signal, and causes the computing unit and therefore the display means to be restarted from the point reached at the moment when the supply voltage V dropped below the threshold voltage Vr. Such a device avoids functional errors in the taximeter due to too low a supply voltage. As the accidental voltage drops are generally of very short duration, i.e. on the order of a second, the interruption of the metering for the duration of a voltage drop introduces only a negligible error on the price displayed.

The output of the comparator 6 is connected to the base of a power amplifier transistor 8 on the emitter of which is found a voltage which reproduces the voltage at the output of the comparator 6. The emitter of the transistor 8 is connected, through a resistor R1, to a capacitor C. The capacitor C is connected to a discharge resistor R2. The transistor 8 may be replaced by a diode.

A comparator 9 compares the voltage at the terminals of C with a reference voltage $V_D$ which is fixed by a Zener diode 10.

As long as the supply voltage V is greater than the safety threshold Vr, the transistor 8 delivers a constant voltage V1 and the capacitor C remains entirely charged under this voltage.

As soon as the supply voltage V becomes lower than the safety threshold Vr, the transistor 8 delivers a zero voltage and the capacitor C discharges exponentially through R2.

A value of the reference voltage $V_D$ of zener diode 10 is chosen a function of the discharge time constant C.R2 and the constant voltage V1, such that the time necessary for the voltage at the terminals of the capacitor C to become less than $V_D$ is greater than a determined time duration, for example 10 seconds, which is a duration clearly longer than that of accidental voltage drops.

Thus, when the supply voltage V becomes greater than the threshold Vr again, the voltage at the terminals of the capacitor C will be less than or greater than the reference voltage $V_D$ according to whether the actual time duration that the supply voltage was greater than or less than the reference time duration.

The taximeter 1 comprises logic circuits 11, for example a microprocessor, which control the storage of the information recorded on the computing unit 2a at the moment of the cut-off. When the supply voltage V returns to exceed the reference voltage Vr, the microprocessor 11 interrogates the output of the comparator 9. If the voltage at the terminals of the capacitor C is greater than $V_D$, indicating that the actual time duration was less than the reference time duration, the microprocessor returns the computing unit and the display means 2 to the value previously stored. If, on the contrary, the voltage at the terminals of C is less than $V_D$, indicating that the actual time duration is greater than the reference time duration, it is deduced that this is a voluntary cut-off of the supply voltage V and the microprocessor controls the computing unit to reset the fare value to zero. Due to this device, if the taxi driver makes the meter work before picking up a client, then voluntarily cuts off the supply of the taximeter so that the display means 2 is extinguished at the moment when the client enters the taxi and then re-establishes the supply of the taximeter immediately before pressing on the "pick-up" switch, the price recorded before the voluntary cut-off of the current is erased.

After the return of the supply voltage of the taximeter, the microprocessor 11 takes a very short period of time, of the order of a hundredth of a second, to interrogate the output of the comparator 9 and, during this period of time, the charge of the capacitor C must be prevented from rising rapidly above the voltage $V_D$. For this reason, the charge time constant R1.C must be relatively high, of the order of a second or more. It must not be too little in comparison with the reaction time of the comparator 9 and the microprocessor 11.

FIG. 3 shows another embodiment of a device for carrying out the anti-fraud process according to the invention. Reference 1 represents a taximeter equipped with a luminous display means 2 and a computing unit 2a. Reference 3 represents the battery of the vehicle which delivers a d.c. voltage V which supplies the taximeter during normal running. References 6,7 and 11 and the terminal A represent parts homologous to those of FIG. 2.

In this embodiment, the taximeter comprises an auxiliary source 12 of direct current of small capacity, for example a small battery which is incorporated in the taximeter and which serves to ensure functioning of the essential units in case of cut-off of the voltage V. Several types of known taximeters comprise an auxiliary source 12 which serves in particular to store the information recorded in the computing unit if there is an accidental drop in the supply voltage V.

The source 12 supplies power to the components of the anti-fraud device. These components are an electronic clock 13, a pulse counter 14 which is connected to the source 13 and which counts the pulses emitted thereby and a memory 15, for example a flip flop, which is connected to the output of the counter 14. The counter 14 has a maximum counting capacity which corresponds to a reference time duration. For example, if the clock 13 oscillates at a frequency of 1 KHz, and if a reference time duration of 10 seconds has been chosen, the maximum capacity of the counter 14 is equal to 10,000. The output of the counter 14 changes state when the counter has counted 10,000 successive pulses and conserves this state until the next return to zero or reset signal whatever the number of pulses received by the counter beyond 10,000. The terminal 14a for returning the counter 14 to zero is connected to the terminal A, i.e. to the output of the comparator 6.

The operation of the counter 14 is as follows:

As long as the supply voltage V is at a normal level, i.e. higher than the safety threshold Vr, the comparator 6 emits a constant voltage which maintains the counter 14 at zero.

If the voltage V drops below the threshold Vr, the comparator 6 cuts the supply voltage V of the taximeter. The microprocessor 11, which is programmed for this, immediately stores the information contained in the computing unit. At the same time, the reset instruction at the input of the counter 14 disappears and the counter then begins to count the pulses emitted by the clock 13. As soon as the supply voltage becomes greater than Vr again, the counter 14 is returned or reset to zero and the microprocessor 11, which is programmed for this, or any other equivalent logic circuit, interrogates the memory 15.

If the memory 15 has changed state, i.e. if the counter 14 has reached its maximum capacity, the microprocessor 11 returns the computing unit 2a and the display means 2 to zero. If the memory 15 has not changed state, the microprocessor 11 switches on the computing unit 2a again, which resumes its fare calculating operations from the fare value stored when the supply voltage V was cut off. The microprocessor 11 is connected to the terminal 15a for resetting or returning the memory 15 to zero and it returns the latter to the initial state after having interrogated it.

The anti-fraud devices according to the invention may be incorporated in the taximeters or associated with existing electronic taximeters which did not comprise one.

To avoid a possibility of fraud which consists in cutting off the supply voltage V of the taximeter several times, each for a duration shorter than the reference duration and in re-establishing it immediately each time, a charge time constant R1.C is chosen which is sufficiently high so that if the time gap separating the re-establishment of the voltage from the following cut-off is shorter than this time constant, the capacitor C is not entirely charged and the voltage value $V_D$ is finally attained at the terminals of the capacitor C, which causes the return to zero of the taximeter.

The various elements constituting the devices which have just been described by way of example may, of course, be replaced by equivalent elements performing the same functions, without departing from the scope of the invention.

What is claimed is:

1. A process for avoiding fraud on the price of the fare indicated by an electronic taximeter of the type powered by a vehicle battery and having a computing unit for calculating the fare value, a luminous display means to display the fare, and a voltage comparator means which compares the supply voltage from the battery with a safety threshold voltage level and which suspends the calculation of the fare in the computing unit when the battery voltage drops below said safety threshold voltage level comprising the steps of:
   comparing the supply voltage level of the taximeter with a safety threshold voltage level;
   measuring the actual time period duration that the supply voltage level is below said safety threshold voltage level;
   comparing the actual time period duration with a reference time period duration when the supply voltage level returns and exceeds said safety threshold voltage level; and
   returning the value of the fare in the computing unit and the luminous display means to zero if the actual time period duration exceeds the reference time period duration, but resuming the calculation of the fare starting with the fare value reached when the operation of the computing unit was suspended if the actual time period duration does not exceed the reference time period duration.

2. A device for avoiding fraud on the price of the fare indicated by an electronic taximeter which is supplied with electrical current by the vehicle battery and having a computing unit for calculating the fare value and a luminous means for displaying the value of the fare, comprising:
   a first voltage comparator means for comparing the supply voltage delivered by the battery with a safety threshold voltage level and for delivering a first output voltage if the supply voltage is greater than said safety threshold voltage level, and for delivering a second output voltage lower than said first output voltage if the supply voltage is lower than said safety threshold voltage level;
   means for suspending the operation of said fare calculating computing unit in response to said first output voltage;
   an R-C circuit comprising a capacitor which is connected to the output of said first voltage comparator through a load resistor and which is connected to a discharge resistor so that when said second output voltage is emitted, said capacitor discharges through said discharge resistor with a determined discharge time constant;
   a second voltage comparator which compares the voltage remaining at the terminals of the capacitor with a second reference voltage intermediate between said first and second output voltages; and
   a logic circuit which receives the output of said second voltage comparator when said first output voltage is emitted from said first voltage comparator, and resets the fare value in the computing unit and the luminous display means to zero when said remaining voltage at the terminals of the capacitor is less than said second reference voltage, and resumes operation of said computing unit starting with the fare value reached when the computing unit was suspended if said remaining voltage is greater than said second reference voltage.

3. A device for avoiding fraud on the price of the fare indicated by an electronic taximeter which is supplied with electrical current by the vehicle battery and having a computing unit for calculating the fare value and a luminous means for displaying the value of the fare, comprising:
   a voltage comparator means for comparing the supply voltage from the battery with a safety threshold voltage level and which outputs a first output voltage if said supply voltage is higher than said safety threshold voltage level and a second output voltage if said supply voltage is lower than said safety threshold voltage level;
   means for cutting off the supply voltage to said taximeter in response to said first output voltage being emitted and for storing information contained in the computing unit representative of the current calculated fare;
   an auxiliary source of DC current incorporated in said taximeter;
   an electronic clock which produces pulses at a predetermined frequency;
   a pulse counter of determined capacity which receives and counts the clock pulses;
   a switching device which is connected to the output of said pulse counter and which changes state if the number of pulses counted by said counter reaches a predetermined count indicating that the actual time that said supply voltage has been lower than said safety threshold voltage level has exceeded a predetermined reference time period duration;

and a logic circuit connected to said switching device which resets the fare value in said computing unit and the luminous display means to zero when said supply voltage again exceeds said safety threshold voltage level if said switching device changes state, but which resumes operation of said computing unit and display means to the fare existing at the time the supply voltage dropped below said safety voltage threshold level when the supply voltage returns to exceed the safety threshold voltage level if said switching device does not change state.

4. Electronic taximeter of the type powered by a vehicle battery and having a computing unit for calculating the fare value, and a luminous means for displaying the fare, and further having means for avoiding frauds on the displayed fare due to voluntary cutting off of the supply voltage from the battery comprising:

means for measuring the actual time period duration that the supply voltage level is below a safety threshold voltage level;

means for comparing the actual time period duration that the supply voltage level was below the safety threshold voltage level with a predetermined time period duration; and means for resetting the fare value in the computing unit and the display means to zero when the supply voltage returns to exceed the safety voltage threshold level if the actual time period duration exceeds the predetermined time period duration, and for returning the computing unit and the display means to the fare which existed at the time the supply voltage dropped below said safety threshold voltage level when the supply voltage returns to exceed the safety threshold voltage level if the actual time period duration does not exceed the predetermined time period duration.

* * * * *